US010354824B2

(12) United States Patent
Copel et al.

(10) Patent No.: US 10,354,824 B2
(45) Date of Patent: *Jul. 16, 2019

(54) PIEZOELECTRONIC SWITCH DEVICE FOR RF APPLICATIONS

(71) Applicant: International Business Machines Corporation, Armonk, NY (US)

(72) Inventors: Matthew W. Copel, Yorktown Heights, NY (US); Bruce G. Elmegreen, Goldens Bridge, NY (US); Glenn J. Martyna, Croton on Hudson, NY (US); Dennis M. Newns, Yorktown Heights, NY (US); Thomas M. Shaw, Peekskill, NY (US); Paul M. Solomon, Yorktown Heights, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 480 days.

This patent is subject to a terminal disclaimer.

(21) Appl. No.: 15/163,821

(22) Filed: May 25, 2016

(65) Prior Publication Data

US 2016/0268083 A1 Sep. 15, 2016

Related U.S. Application Data

(62) Division of application No. 14/529,380, filed on Oct. 31, 2014, now Pat. No. 9,472,368.

(51) Int. Cl.

*H01L 41/09* (2006.01)
*H01H 57/00* (2006.01)
*H01H 49/00* (2006.01)

(52) U.S. Cl.

CPC ........... *H01H 57/00* (2013.01); *H01H 49/00* (2013.01); *H01H 2057/006* (2013.01)

(58) Field of Classification Search

CPC ............................... H01H 57/00; H01H 49/00

(Continued)

(56) References Cited

U.S. PATENT DOCUMENTS 5,695,859 A * 12/1997 Burgess ................ H01H 1/029 200/85 R
7,848,135 B2 12/2010 Elmegreen et al.

(Continued)

OTHER PUBLICATIONS

List of IBM Patents or Patent Applications Treated as Related; (Appendix P), Filed Sep. 1, 2016; 2 pages.

(Continued)

*Primary Examiner* — Thomas M Dougherty
(74) *Attorney, Agent, or Firm* — Cantor Colburn LLP; Vazken Alexanian

(57) ABSTRACT

A piezoelectronic switch device for radio frequency (RF) applications includes a piezoelectric (PE) material layer and a piezoresistive (PR) material layer separated from one another by at least one electrode, wherein an electrical resistance of the PR material layer is dependent upon an applied voltage across the PE material layer by way of an applied pressure to the PR material layer by the PE material layer; and a conductive, high yield material (C-HYM) comprising a housing that surrounds the PE material layer, the PR material layer and the at least one electrode, the C-HYM configured to mechanically transmit a displacement of the PE material layer to the PR material layer such that applied voltage across the PE material layer causes an expansion thereof and an increase the applied pressure to the PR material layer, thereby causing a decrease in the electrical resistance of the PR material layer.

15 Claims, 3 Drawing Sheets

(58) Field of Classification Search
USPC .......................................... 310/328, 363–365
See application file for complete search history.

(56) References Cited

U.S. PATENT DOCUMENTS

| | | | | |
|---|---|---|---|---|
| 8,159,854 | B2 | 4/2012 | Elmegreen et al. | |
| 8,247,947 | B2 | 8/2012 | Elmegreen et al. | |
| 8,405,279 | B2 | 3/2013 | Elmegreen et al. | |
| 8,661,917 | B2 * | 3/2014 | Jheng | H01B 1/24 73/862.68 |
| 9,263,664 | B1 | 2/2016 | Bryce et al. | |
| 9,287,489 | B1 | 3/2016 | Bryce et al. | |
| 9,293,687 | B1 | 3/2016 | Bryce et al. | |
| 9,472,368 | B2 * | 10/2016 | Copel | H01H 57/00 |
| 2001/0050801 | A1 * | 12/2001 | Behin | G02B 6/357 359/298 |
| 2012/0297885 | A1 * | 11/2012 | Hou | G01L 1/18 73/718 |
| 2014/0169078 | A1 | 6/2014 | Elmegreen et al. | |
| 2014/0340189 | A1 * | 11/2014 | Hou | H01H 13/023 338/198 |
| 2015/0255699 | A1 | 9/2015 | Elmegreen et al. | |
| 2015/0269984 | A1 | 9/2015 | Elmegreen et al. | |
| 2016/0064641 | A1 | 3/2016 | Elmegreen et al. | |
| 2016/0111154 | A1 | 4/2016 | Elmegreen et al. | |
| 2016/0126044 | A1 | 5/2016 | Copel et al. | |
| 2016/0126446 | A1 | 5/2016 | Bryce et al. | |
| 2016/0126447 | A1 | 5/2016 | Bryce et al. | |
| 2016/0126448 | A1 | 5/2016 | Bryce et al. | |
| 2017/0148592 | A1 * | 5/2017 | Tabib-Azir | H01H 57/00 |

OTHER PUBLICATIONS

Bruce G. Elmegreen et al., “Low Voltage Transistor and Logic Devices With Multiple, Stacked Piezoelectronic Layers”, U.S. Appl. No. 15/248,488, filed Aug. 26, 2016.

List of IBM Patents or Patent Applications Treated as Related; (Appendix P), Filed Nov. 29, 2017; 2 pages.

Bruce G. Elmegreen et al., “Piezoelectronic Device With Novel Force Amplification”, U.S. Appl. No. 15/825,171, filed Nov. 29, 2017.

List of IBM Patents or Patent Applications Treated as Related; (Appendix P), Filed May 25, 2016; 2 pages.

Matthew W. Copel et al., “Piezoelectronic Switch Device for RF Applications”, U.S. Appl. No. 14/745,521, filed Jun. 22, 2015.

Bruce G. Elmegreen et al., “Low Voltage Transistor and Logic Devices With Multiple, Stacked Piezoelectronic Layers”, U.S. Appl. No. 15/131,484, filed Apr. 18, 2016.

* cited by examiner

PIEZOELECTRONIC SWITCH DEVICE FOR RF APPLICATIONS

DOMESTIC PRIORITY

This application is a division of U.S. patent application Ser. No. 14/529,380, filed Oct. 31, 2014, the disclosure of which is incorporated by reference herein in its entirety.

STATEMENT OF GOVERNMENT INTEREST

This invention was made with Government support under Contract No.: N66001-11-C-4109 awarded by Defense Advanced Research Projects Agency (DARPA). The Government has certain rights in this invention.

BACKGROUND

The present invention relates generally to integrated circuit devices and, more particularly, to a piezoelectronic switch device for radio frequency (RF) applications.

A piezoelectronic transistor (PET) has been proposed as a low-voltage, high-frequency switch in which a gate voltage expands a piezoelectric (PE) transducer, generating a high pressure in an adjacent piezoresistive (PR) material which then transforms from semiconducting electrical behavior to metallic electrical behavior. The PET may be embodied as a 3-terminal device, or, with an intervening low-permittivity dielectric layer, as a 4-terminal device. The three and four terminal PETs are embedded in a material with high Young's modulus (HYM) to resist deformation. Logic circuits analogous to conventional complementary metal oxide semiconductor (CMOS) devices may be made from combinations of PETs as part of a new field of technology termed piezotronics.

In RF signal electronics, at frequencies above about 1 GHz, there is need for rapid switching between RF channels, such as for example in applications utilizing cell phone and radar technology while switching between different antennae, or tuning an antenna by switching between elements in a capacitor bank. In, for example, a cell phone application, microelectromechanical switches (MEMS) take up relatively large amounts of space, require high voltages (e.g., 30-80 V), have expensive hermetic packaging, limited endurance (e.g., $10^8$-$10^{10}$ cycles) and poor frequency response (e.g., $10^4$-$10^6$ Hz). Thus, MEMS are not ideal for this type of application. On the other hand, semiconductor switches also have certain drawbacks such as, for example, poor isolation in an OFF state and large insertion loss in an ON state.

In general, ON/OFF switches have the well-known problem of, upon opening of the switch, such that as the circuit resistance R rapidly increases, the magnetic flux trapped in the circuit by its inductance L collapses on an ever-shortening time scale as the time constant L/R drops to zero, thus resulting in high induced voltages by Faraday's law and an undesirable RF voltage pulse, spark, or arc. Switches with no RF noise are useful in situations where RF quiet is required, such as airplanes during takeoff and landing, near sensitive radar and radio astronomical antennae, and in military settings. Switches that do not spark or arc are also useful in situations where there are volatile gases that could explode if exposed to a spark or arc. Arc-free switches also have greater endurance in that switch contacts are not damaged by arcing.

SUMMARY

In an exemplary embodiment, a piezoelectronic switch device for radio frequency (RF) applications includes a piezoelectric (PE) material layer and a piezoresistive (PR) material layer separated from one another by at least one electrode, wherein an electrical resistance of the PR material layer is dependent upon an applied voltage across the PE material layer by way of an applied pressure to the PR material layer by the PE material layer; and a conductive, high yield material (C-HYM) comprising a housing that surrounds the PE material layer, the PR material layer and the at least one electrode, the C-HYM configured to mechanically transmit a displacement of the PE material layer to the PR material layer such that applied voltage across the PE material layer causes an expansion thereof and an increase the applied pressure to the PR material layer, thereby causing a decrease in the electrical resistance of the PR material layer.

In another embodiment, a radio frequency (RF) switching circuit includes an RF signal source; a first piezoelectronic switch device in parallel with the RF signal source; and a second piezoelectronic switch device in series with the RF signal source. The first and second piezoelectronic switch device each include a piezoelectric (PE) material layer and a piezoresistive (PR) material layer separated from one another by at least one electrode, wherein an electrical resistance of the PR material layer is dependent upon an applied voltage across the PE material layer by way of an applied pressure to the PR material layer by the PE material layer; and a conductive, high yield material (C-HYM) comprising a housing that surrounds the PE material layer, the PR material layer and the at least one electrode, the C-HYM configured to mechanically transmit a displacement of the PE material layer to the PR material layer such that applied voltage across the PE material layer causes an expansion thereof and an increase the applied pressure to the PR material layer, thereby causing a decrease in the electrical resistance of the PR material layer.

In another embodiment, an RF switch device includes a pair of electrodes configured to be brought into contact with one another by application of a mechanical force; and one of the pair of electrodes having a piezoresistive (PR) material layer affixed thereto such that application of pressure to the PR material layer from the pair of electrodes being brought into contact with one another causes a decrease in an electrical resistance of the PR material layer.

BRIEF DESCRIPTION OF THE SEVERAL VIEWS OF THE DRAWINGS

Referring to the exemplary drawings wherein like elements are numbered alike in the several Figures.

DETAILED DESCRIPTION

Figure 1:
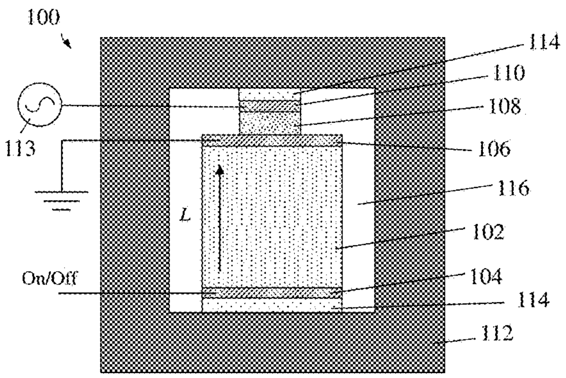
FIG. 1 is a schematic cross-sectional diagram of a 3-terminal piezoelectronic transistor (PET) device for RF applications having a piezoelectric (PE) material layer coupled to a piezoresistive (PR) material layer, according to an exemplary embodiment.

Disclosed herein are embodiments of a PET device for RF applications that address a problem with respect to high frequency switching of RF signals with characteristics of high longevity, and small switch format and voltage. Existing approaches include semiconductor switches that have poor isolation in the OFF state and large insertion loss in the ON state, as well as MEMS devices that take up more space, require high voltages, have expensive hermetic packaging, limited endurance and poor frequency response.

The use of a PET device for RF applications addresses the above mentioned switch issues, in that the device is compact, does not need an isolation package, is fast and has long endurance. A PET also switches on and off much more smoothly than conventional contact-type RF switch designs, thereby preventing high voltage surges upon switching that could otherwise lead to unwanted RF noise, sparking or arcing. The smooth operation also improves the endurance of the device, allowing for many more on/off cycles before metal contact degeneration since it avoids the high voltage spikes that degrade the contacts in other devices. The lack of arcing also allows the switch to be used in environments with volatile gases.

The PET concept may be used to implement a switch in the foregoing applications in at least two embodiments. Overall, a PET design with RF screening provides a fast, high endurance switch. For certain applications, one type of PET switch may not provide a desired ON/OFF ratio. Thus, a switch utilizing a PET together with contacts that open/close has a very high ON/OFF ratio, while the RF pulse is remediated by the relatively slow turn off of the PR resistance, which still increases the endurance through reduced contact damage.

The embodiments described herein include designs for a 3-terminal or 4-terminal piezoelectronic switch that are useful at RF frequencies, as well as a mechanically activated, 2-terminal piezoresistive switch that has similarly useful properties. The new PET designs are characterized by their inclusion a conducting material for the High Young's Modulus housing (which may be abbreviated as a C-HYM) to shield out stray RF noise, and a grounding of the adjacent terminals that are separated by the low-permittivity dielectric layer to reduce RF interference between the two parts of the switch. In this device, the switch is turned on by application of a voltage to the lower terminal, causing the PE to expand and compress the PR. This compression reduces the resistance in the PR, and allows the RF frequency on the connected top terminal to pass through, thereby activating the RF transmission line. The switch is turned off by applying a low voltage or ground to the lower terminal, which causes the PE to contract and decompress the PR. This decompression increases the resistance in the PR and stops the flow of RF current through the RF transmission line. The main characteristic of the mechanically activated 2-terminal PR switch is its ability to smoothly increase and decrease the current in a circuit as the switch turns on and off, reducing or eliminating the RF pulse on turn off and the consequent contact damage.

A principal advantage of both the piezoelectronic RF switch, also designated herein as a PET-RF, and the piezoresistive PR switch, is to open and close RF circuits used in communication, radar, etc., without introducing stray radio emission from sparks, arcs, or current surges that occur in mechanical switches which open or close metal contacts in air. The PET-RF and PR switches will also have much longer lifetimes (number of cycles) than conventional air-gap RF switches because the PET-RF and PR switches have no current surges through nanoscale irregularities on metallic contact points, as a conventional air-gap switch does. These nanoscale current surges heat the metal and cause rapid erosion in conventional air-gap switches. The PET-RF and PR switches, on the other hand, automatically modulate the current with a slow rise time or decay time upon closing or opening the switch, respectively. Because there are no metallic contacts with high voltage differences that can create heat spikes in locally high current surges, the PET-RF and PR switches are therefore smoother operating and longer-lasting than conventional air-gap RF switches.

Switches with no RF noise are also useful in situations where RF quiet is required, such as in airplanes during takeoff and landing, near sensitive radar and radio astronomical antennae, and in military settings. Switches that do not spark or arc are also useful in situations where there are volatile gases that could explode if exposed to a spark or arc.

An anticipated advantage of the PET-RF is that the high figure of merit (FOM), which is the characteristic RC time constant of the device, enables operation at higher frequencies. In particular, millimeter wavelengths (e.g., 30-60 GHz) are an upcoming band into which applications are moving (e.g., $5^{th}$ Gen cellphone at 30 GHz versus the current cellphone at 2 GHz). In such applications, a PIN diode requires an on-drive current even when not switching, thus wasting power. Further, semiconductor FET switches have a poor FOM. Additional information regarding the FOM of various switch technologies is presented in further detail hereinafter.

The intrinsic speed of a PET-RF is determined by the longer of the sound crossing time through the PE, and the RC time of the circuit. The sound crossing time enters because of the finite speed of propagation of the expansion of the PE, which regulates the resistance through the PR. The RC time of the circuit may include other PET's and devices with various fan outs and fan ins. Designs that minimize sonic oscillations and their associated resistance oscillations have critical damping, which for purely resistive damping, means that the RC time associated with each PET circuit is comparable to the sonic time in that PET. In the case of a PET-RF, the characteristic timescale for opening and closing the switch can be adjusted by the increasing or decreasing the thickness of the PE; this timescale can be longer than the RF cycle time, for example, which is another way to minimize interference between the RF signal and the operating components of the switch. The intrinsic speed of the PR switch is determined by the compression time of the PR, which is the sound crossing time over the thin layer of the PR. This is generally much shorter than the sound crossing time through the thicker layer of the PE in a PET-RF switch. Slow controlled switching may be achieved by increasing the rise/fall time of the control voltage; this enables one to control the rate of decay of the magnetic energy to minimize both the RF interference and heating of the contact.

Referring now to FIG. 1, there is shown a cross sectional view of a 3-terminal PET-RF 100. As is shown, the 3-terminal PET-RF 100 includes a PE material layer 102 disposed between a gate electrode 104 and a common electrode 106, a PR material layer 108 disposed between the common electrode 106 and a sense electrode 110, and a conductive, high yield (Young's modulus) material (C-HYM) 112 serving as a housing that surrounds the materials and electrodes. The common electrode 106 is grounded to reduce RF transmission from an RF input signal 113 (which is coupled to the sense electrode 110 at the PR material layer 108) to the switch input On/Off (which is coupled to the gate electrode 104 at the PE material layer 102). The gate electrode 104 and sense electrode 110 are separated from the C-HYM 112 by insulator layers 114.

The C-HYM 112 that surrounds all of the components (and acts as a Faraday shield to shield out stray RF noise) may be made from tungsten (W) or some other suitably strong conducting material. The electrode materials may be made from strontium ruthenium oxide ($SrRuO_3$ (SRO)), platinum (Pt), W, or other hard conducting materials. The PE material layer 102 may be made from a relaxor such as PMN-PT (lead magnesium niobate-lead titanate) or PZN-PT (lead zinc niobate-lead titanate) or other PE materials typically made from perovskite titanates. Such PE materials have a large value of displacement/V $d_{33}$, e.g., $d_{33}$=2500 pm/V, support a relatively high piezoelectric strain (~1%), and have a relatively high endurance. The PE could also be made from PZT (lead zirconate titanate). The PR material layer 108 is a material that undergoes an insulator-to-metal transition under increasing pressure in a range such as 0.4-3.0 GPa. Examples of PR materials include samarium selenide (SmSe), thulium telluride (TmTe), nickel disulfide/diselenide ($Ni(S_xSe_{1-x})_2$), vanadium oxide ($V_2O_3$) doped with a small percentage of Cr, and calcium ruthenium oxide ($Ca_2RuO_4$). The insulator layers 114 may have a relatively high Young's modulus, for example, 60 gigapascals (GPa) to 250 GPa, a relatively low dielectric constant (e.g., about 4-12), and a high breakdown field. Suitable insulator materials include, for example, silicon dioxide ($SiO_2$) or silicon nitride ($Si_xN_y$).

Again, a PE material is a material that may either expand or contract when an electric potential is applied thereacross, while a PR material in the present context is a material that changes resistivity with applied mechanical stress so as to transition from an insulator to a conductor. As further shown in FIG. 1, a medium 116 between the C-HYM 112 and the various electrodes, insulators, PE and PR material layers may remain as a void, or be filled with a soft solid material or a gas (e.g., air).

In operation, an input voltage (On/Off) coupled to the gate electrode 104 with respect to the grounded common electrode 106 is applied across the PE material layer 102 (the arrow in the figures representing the direction of the electric field when the voltage is applied), which causes an expansion and displacement of the crystal material of the PE material layer 102 that in turn acts on the PR material layer 108 via the C-HYM 112. That is, the induced pressure from the PE material layer 102 causes an insulator-to-metal transition so that the PR material layer 108 provides a conducting path between the common electrode 106 and the sense electrode 110. The C-HYM 112 ensures that the displacement of the PE material layer 102 is transmitted to the PR material layer 108 rather than the surrounding medium 116.

Figure 2:
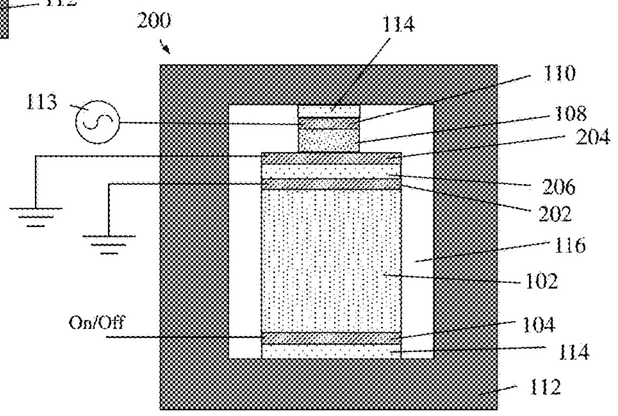
FIG. 2 is a schematic cross-sectional diagram of a 4-terminal PET device for RF applications having a PE material layer coupled to a PR material layer, according to another exemplary embodiment.
Figure 3:
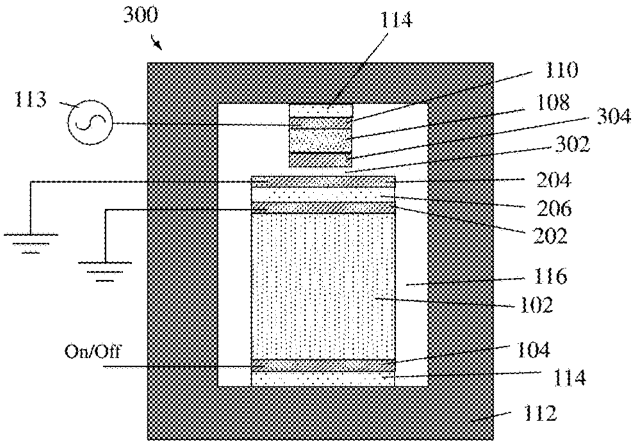
FIG. 3 is a schematic cross-sectional diagram of a 4-terminal PET device for RF applications having a PE material layer selectively coupled to a PR material layer, and including an air gap, according to another exemplary embodiment.

Before further details regarding the principles of operation of the PET-RF 100 are described, additional embodiments are first presented in FIGS. 2 and 3. In particular, FIG. 2 illustrates a cross-sectional view of a 4-terminal PET-RF device 200 having a PE material layer coupled to a PR material layer, according to another exemplary embodiment. For ease of illustration, like elements are designated with like reference numerals in the figures. In the 4-terminal PET-RF device 200, a single common electrode is replaced with a second gate electrode 202 (with respect to the first gate electrode 104) and a second sense electrode 204 (with respect to the first sense electrode 108). The second gate electrode 202 and the second sense electrode 204 are separated from one another by a low-permittivity, high yield-strength insulator layer 206. The second gate electrode 202 is grounded to reduce RF noise in the PE material layer 102.

Referring now to FIG. 3, there is shown a cross-sectional view of a 4-terminal PET-RF device 300 according to another exemplary embodiment. In contrast to the embodiment of FIG. 2, the PET-RF device 300 includes an air gap 302 between the movable top portion of the PE assembly and the bottom of the PR assembly. Optionally, an additional electrode 304 is formed on the bottom of the PR material layer 108, and separated from the second sense electrode 204 by the air gap 302. The air gap 302 provides high impedance between the two terminals of the RF signal in the OFF position, when the PE material layer 102 is contracted. However, when the PE material layer 102 is expanded, the air gap 302 closes and the adjacent metal layers 304, 204 contact in the ON position.

A basic principle behind the operation of the PET-RF (such as shown in any of the embodiments of FIGS. 1-3) is that the capacitance, C, of the PR material layer 108, which produces a capacitive reactance in the RF circuit, is functionally in parallel with the resistance, R, of the PR material layer 108. The total impedance in the RF circuit is thus given by the expression:

$$Z=(1/R+j\omega C)^{-1}$$

where j=sqrt(−1) and ω is the RF frequency in radians per second (=2πf for frequency f in Hz).

The capacitance in the PR material layer 108 may be determined as follows. Assuming a typical dielectric in the PR material layer 108 equal to $\varepsilon=5\varepsilon_0=4.43\times10^{-11}$ F/m, and further assuming a PR material layer width in a square shape is 1 micron and the height is 25 nm, then $C=1.77\times10^{-16}$ F or 1.77 ff. As a first example of a capacitive reactance, for an RF frequency of 10 GHz, then 1/(ωC)=9000 Ohms (a). The resistance R in the PR is the same 9000Ω if the resistivity is ρ=0.36 Ω-m for the same dimensions. The impedance scales with the ratio of the PR thickness to the PR area, and the product of the resistive to the capacitive reactance equals RωC=ρεω.

As a second example of a capacitive reactance, using an RF frequency of 60 GHz, for the same dimensions, then 1/(ωC)=1500Ω. Here, the resistance in the PR is the same as the capacitive reactance if the resistivity is ρ=0.06 Ω-m. Such resistivities can be achieved with, for example, $Sm_{1-x}Eu_xS$ compounds, for x~0.5.

The PET-RF switches from OFF (when the impedance in the RF circuit is high) to ON (when the impedance is low) as the resistance in the PR drops from some high value in its low-pressure state to some low value in its high-pressure state. If the resistance in the OFF state is comparable to the capacitive reactance, then the impedance in the OFF state is $1/\sqrt{2}$ times this capacitive reactance, which can be high enough to block the RF signal in the circuit. However, when the resistance drops to its low value in the ON state, the impedance drops also to be about equal to the low resistance. A resistance OFF/ON ratio in the range from 1000 to 10000 will regulate the impedance of PET-RF switch by about this same factor.

The OFF/ON ratio depends on the compression in the PR, which in turn depends on the expansion of the PE. The resistivity in PR materials decreases exponentially with the applied pressure, P, approximately as exp(−4P). Thus, the OFF/ON ratio is exp(4P). The pressure in the PR material depends on the dimensions of the PR and PE materials, where l=thickness of the PR, L=thickness of the PE, a=cross sectional area of the PR, A=cross sectional area of the PE, and the pressure also dependent on the Young's moduli, YPR for the PR and YPE for the PE. The pressure in the PR is also related to the PE expansion coefficient $d_{33}$ and voltage on the PE, V, as given by the expression:

$$P = \frac{d_{33}V}{\frac{l}{Y_{PR}} + \frac{rL}{Y_{PE}}}$$

For a piezoelectric material PZT with the aspect ratio assumed, $d_{33}$~0.15 nm/V and $Y_{PE}$~100 GPa. For typical PR material, $Y_{PR}$~80 GPa. Then, with l=25 nm, L=1 micron (μm), and r=a/A=1/25, the above equation yields P~0.2 V for P in GPa and V in Volts. In that case, the OFF/ON ratio is exp(0.8V), which is in the above range from 1000 to 10000 when the voltage ranges from 8.6 V to 11.5 V.

In the case of the FIG. 3 embodiment where there is an air gap between the top of the movable PE structure and the bottom of the PR structure in the OFF state, the resistance in the OFF state is infinite. An advantage of this configuration is that then the resistivity of the PR (ρ in the above equations) may be reduced, thus allowing the ON resistance to be lower when the PE expands and the metal layers on either side of the air gap contact one other. Then the OFF/ON ratio in the impedance is larger.

Another key aspect of the gap contacts (204, 304) in FIG. 3 is that although they are contacts between highly conductive materials, there will be no spark, arc, or high voltage surge at the times of contact or separation. This is because at these times, the resistivity in the PR material layer 108 is high and the current is low, limiting the strength of magnetic fields generated by this current, and limiting the voltage across the gap 302. Still another result of this smooth turn on and turn off of the current is a longer lifetime for the contacts, which suffer no high temperature spikes when the voltage between them always stays low. The application of a PET-RF to high current switching should, however, merit careful consideration of the heat dissipated in the PR material. Wider PR and PE layers will permit more current to pass for the same dissipation rate per unit area.

Figure 4:
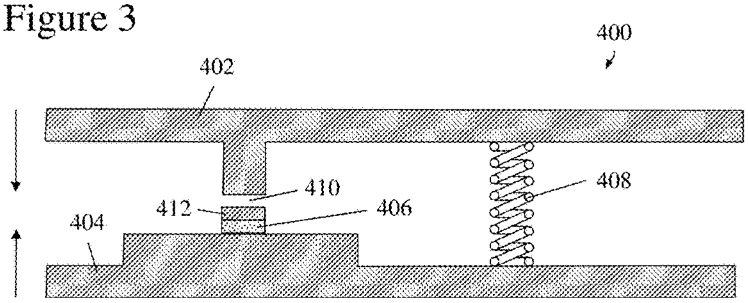
FIG. 4 is a schematic cross-sectional diagram of an RF switch device featuring a pair of electrodes, configured to be brought together by application of a mechanical force and including a PR material layer affixed to one of the electrodes.

It will be appreciated that combination of an air gap with a PR switch device is not necessarily limited to those applications involving the use of a PE layer to provide an applied pressure to the PR material. For example, FIG. 4 is a schematic cross-sectional diagram of an RF switch device 400 featuring a pair of electrodes 402, 404, configured to be brought together by application of a mechanical force (arrows) and including a PR material layer 406 affixed to one of the electrodes (404). A spring 408 or other suitable biasing mechanism may be used to bias the electrodes apart when the switch device 400 is in an open position so as to define an air gap 410 between the electrodes 402, 404. In addition (and similar to the embodiment of FIG. 3), another electrode layer 412 may optionally be formed on the PR material layer 406 so that the air gap 410 is defined between electrode layer 412 and electrode 402.

The switch device 400 uses this smoothing principle for a PR-modulated switch exclusively without a PE. This is in principle, an arc-free switch that utilizes only a PR material layer 406 in series with the circuit. The embodiment of FIG. 4 may be mechanically operated with, for example, one ounce of force adequate to change the PR state from insulator to conductor if the PR material layer 406 is on the order of 10 microns in size. It is noted that pressures on the order of a GPa are required to make the PR change conductivity states. One ounce is equivalent to 0.278 Newtons and one GPa is $10^9$ N/m$^2$; therefore, one GPa corresponds to $3.6\times10^9$ ounces/m$^2$. The PR cross sectional area required to convert one ounce of force into 1 GPa of pressure is thus $2.78\times10^{-10}$ m$^2$, which is (16.7 μm)$^2$, corresponding to a PR width of 16.7 μm. The current density through such a tip is $3.6\times10^9$ Amp/m$^2$ for 1 Amp of current, which is a reasonable current density for this type of material.

Figure 5:
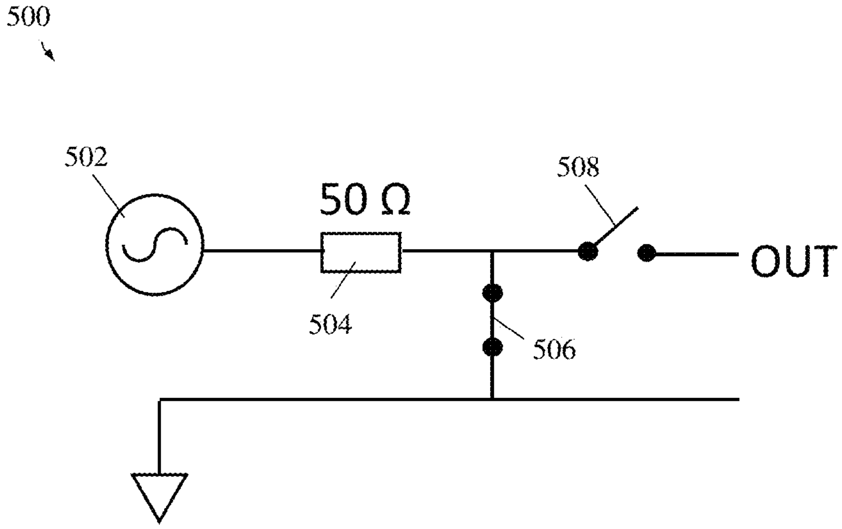
FIG. 5 is a schematic diagram of an exemplary switching circuit that may be formed using a 3-terminal PET device of FIG. 1 and a 4-terminal PET device of FIG. 2.

Referring now to FIG. 5, there is shown is a schematic diagram of an exemplary RF switching circuit 500 that may be formed using a 3-terminal PET-RF device such as shown in FIG. 1 and a 4-terminal PET-RF device such as shown in FIG. 2 or FIG. 3. As shown in FIG. 5, the circuit 500 includes an RF signal source 502, a matching impedance 504 (e.g., 50Ω), a 3-terminal PET-RF device 506 in parallel with the RF signal source 502, and a 4-terminal PET-RF device 508 in series with the RF signal source 502. In operation, when the circuit 500 on, the 4-terminal PET-RF device 508 is closed and 3-terminal PET-RF device 506 is open. When the switch is off (as specifically illustrated in FIG. 5) the 3-terminal PET-RF device 506 acts as a short circuit to reduce the input of incoming signal on RF signal source 502. This reduces undesired signal passing through the capacitance of the 4-terminal PET-RF device 508 and reduces the danger of burn-out thereof by a sudden strong undesired signal.

The following Table I below compares the parameters of the PET-RF switch (rightmost column) with other technologies. The low FOM and reasonable IP3 are evident, where the IP3 is the $3^{rd}$ order intercept point. The lower/more negative the IP3, the more linear the switch, which is a requirement to avoid introducing higher harmonics of the signal. It should be noted that the PIN diode requires drive current to maintain the on state (not just during switching).

A simple small-signal figure of merit for RF/millimeter wave switches is the characteristic time constant (FOM) and its associated frequency (Fc), given by the expression:

$$FOM = R_{ON}C_{OFF},\ F_C = ½\pi(FOM),$$

with short times and high frequency desirable. Table I below compares certain state of the art RF and millimeter wave switch technologies, including their small signal (FOM, $F_C$) and large signal (IP3) figures of merit with preliminary results of the new switch concept highlighted in the rectangular boxes.

TABLE I

| Technology | 0.15 um InGaAs/InP PIN diode [3] | 0.15 um GaAs HEMT [4] | 0.5 um GaN HEMT [5] | 90 nm bulk CMOS FET [6] | 0.18 um HRS SOI [7] | SOS [8] | Piezo MEMS [9] | Simulated SmSe PER |
|---|---|---|---|---|---|---|---|---|
| FOM [fs] | 30 | 324 | 464 | 264 | 200 | 179 | 34 | 14 |
| FC [THz] | 5.3 | 0.5 | 0.3 | 0.6 | 0.8 | 0.9 | 4.7 | 11.4 |
| IP3 device [dBm] | N/A | N/A | N/A | N/A | N/A | N/A | N/A | 55.4 |
| Nbr terminals | 2 | 3 | 3 | 3 | 3 | 3 | 4 | 4 |
| Freq switch [GHz] | 93.5 | 60 | 5.5 | 77 | 3 | 1 | 60 | 30 |
| IL switch [dB] | 1.8 | 2 | 1 | 2.7 | 0.5 | 0.25 | 1.6 | 0.2 |
| I switch [dB] | 40 | 32 | 30 | 29 | 28 | 44 | 24 | 20 |
| IP3 switch [dBm] | N/A | N/A | 72 | N/A | 68 | 70 | N/A | 75 |

As will thus be appreciated, in the context of RF applications the above described PET-RF and PR switch device embodiments offer substantial improvements over other RF switching technologies, such as MEMS devices by having a higher high ON/OFF ratio and faster switching, along with an extended lifetime in the case of FIGS. 1 and 2 due to the lack of making/breaking contacts. The embodiments of FIGS. 3 and 4 have turnoff slowed by the PR material, which eliminates arcing.

While the invention has been described with reference to an exemplary embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

The invention claimed is:

1. An RF switch device, comprising:

a pair of electrodes configured to be brought into contact with one another by application of a mechanical force; and one of the pair of electrodes having a piezoresistive (PR) material layer affixed thereto such that application of pressure to the PR material layer from the pair of electrodes being brought into contact with one another causes a decrease in an electrical resistance of the PR material layer.

2. The device of claim 1, further comprising a biasing mechanism configured to bias the pair electrodes apart when the switch device is in an open position so as to create an air gap between the pair of electrodes.

3. The device of claim 2, wherein the biasing mechanism is a spring.

4. The device of claim 1, further comprising an additional electrode on one of the pair of electrodes.

5. The device of claim 4, wherein the air gap is between the additional electrode and another of the pair of electrodes.

6. The device of claim 1, wherein the PR material layer has a cross sectional area sufficient to allow a change in the PR material layer from a high resistance state to a low resistance state when the application of the mechanical force is about 1 ounce.

7. The device of claim 6, wherein the cross sectional area of the PR material layer is $2.78\times10^{-10}$ meters$^2$.

8. The device of claim 6, wherein a width of the PR material layer is 16.7 micrometers.

9. The device of claim 6, wherein a current density through the PR material layer is $3.6\times10^{9}$ Amperes/meters$^2$ for 1 Ampere of current.

10. The device of claim 1, wherein the PR material layer comprises samarium selenide (SmSe).

11. The device of claim 1, wherein the PR material layer comprises thulium telluride (TmTe).

12. The device of claim 1, wherein the PR material layer comprises nickel disulfide/diselenide ($Ni(S_xSe_{1-x})_2$).

13. The device of claim 1, wherein the PR material layer comprises vanadium oxide ($V_2O_3$) doped with chrome (Cr).

14. The device of claim 1, wherein the PR material layer comprises calcium ruthenium oxide ($Ca_2RuO_4$).

15. The device of claim 1, wherein the PR material layer comprises two or more of samarium selenide (SmSe), thulium telluride (TmTe), nickel disulfide/diselenide ($Ni(S_xSe_{1-x})_2$), vanadium oxide ($V_2O_3$) doped with chrome (Cr), and calcium ruthenium oxide ($Ca_2RuO_4$).

* * * * *